(12) United States Patent
Stelzer et al.

(10) Patent No.: US 12,629,922 B2
(45) Date of Patent: May 19, 2026

(54) METHOD FOR ELECTRICALLY CONTROLLING A FUNCTIONAL ELEMENT ENCLOSED IN A GLAZING UNIT

(71) Applicant: SAINT-GOBAIN GLASS FRANCE, Courbevoie (FR)

(72) Inventors: Richard Stelzer, Aachen (DE); Bastian Klauss, Kempen (DE); Michael Zeiss, Heinsberg-Haaren (DE); Doane Shelby Craig, Herzogenrath (DE)

(73) Assignee: SAINT-GOBAIN SEKURIT FRANCE, Thourotte (FR)

( * ) Notice: Subject to any disclaimer, the term of this patent is extended or adjusted under 35 U.S.C. 154(b) by 516 days.

(21) Appl. No.: 17/928,808

(22) PCT Filed: May 27, 2021

(86) PCT No.: PCT/EP2021/064212
§ 371 (c)(1),
(2) Date: Nov. 30, 2022

(87) PCT Pub. No.: WO2021/254761
PCT Pub. Date: Dec. 23, 2021

(65) Prior Publication Data
US 2023/0219325 A1 Jul. 13, 2023

(30) Foreign Application Priority Data
Jun. 16, 2020 (EP) .................................... 20180208

(51) Int. Cl.
*B32B 17/10* (2006.01)
*B60J 1/02* (2006.01)
(Continued)

(52) U.S. Cl.
CPC ........... *B32B 17/10036* (2013.01); *B60J 1/02* (2013.01); *B60J 1/08* (2013.01); *B60J 1/18* (2013.01);
(Continued)

(58) Field of Classification Search
CPC .......... B32B 17/10036; B32B 17/1077; B32B 27/306; B32B 27/36; B32B 2605/00;
(Continued)

(56) References Cited

U.S. PATENT DOCUMENTS

2012/0026573 A1 2/2012 Collins et al.
2013/0271814 A1 10/2013 Brown
(Continued)

FOREIGN PATENT DOCUMENTS

CN 103221879 A 7/2013
CN 106461998 A 2/2017
(Continued)

OTHER PUBLICATIONS

English Machine Translation Of jJP 2013072895, Hayata et al (Year: 2025).*
(Continued)

*Primary Examiner* — Donald L Raleigh
(74) *Attorney, Agent, or Firm* — CUSHMAN PARTNERS, LCC

(57) ABSTRACT

A method for electrically controlling a functional element with electrically controllable optical properties enclosed in a glazing unit includes controlling the optical properties by a control unit connected to two transparent flat electrodes of the functional element, and applying a voltage by the control unit between the flat electrodes and the polarity of the voltage is periodically changed. The voltage has a trapezoidal profile and by the control unit an increasing electrical voltage is applied for charging the functional element, the
(Continued)

Figure 1:
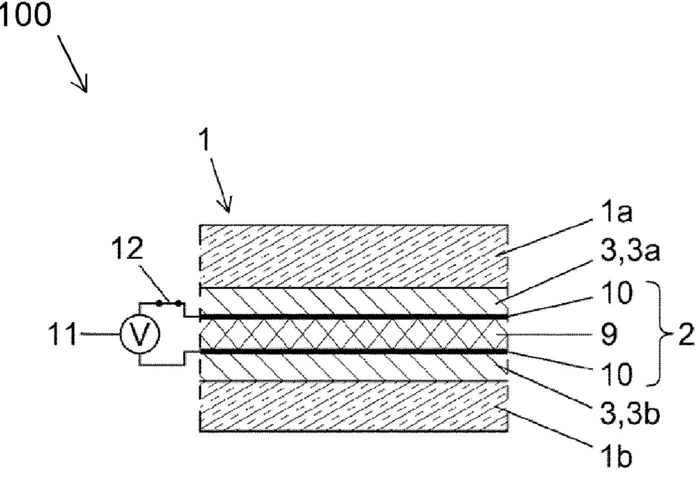

electrical voltage increasing to a first peak value, the electrical voltage is reduced from the first peak value to a final voltage for discharging the functional element, the functional element is charged with the increasing electrical voltage with reversed polarity, wherein the electrical voltage increases to a second peak value, the electrical voltage is reduced from the second peak value to the final voltage for discharging the functional element.

18 Claims, 5 Drawing Sheets

(51) Int. Cl.

| | |
|---|---|
| ***B60J 1/08*** | (2006.01) |
| ***B60J 1/18*** | (2006.01) |
| ***B60J 3/04*** | (2006.01) |
| *B32B 27/30* | (2006.01) |
| *B32B 27/36* | (2006.01) |
| *H03K 4/94* | (2006.01) |

(52) U.S. Cl.
CPC ............. *B60J 3/04* (2013.01); *B32B 17/1077* (2013.01); *B32B 27/306* (2013.01); *B32B 27/36* (2013.01); *B32B 2605/00* (2013.01); *H03K 4/94* (2013.01)

(58) Field of Classification Search
CPC ........ B32B 17/10174; B32B 17/10761; B32B 2419/00; B32B 2479/00; B32B 17/10504; B60J 1/02; B60J 1/08; B60J 1/18; B60J 3/04; H03K 4/94; H02M 3/158; H02M 7/537
See application file for complete search history.

(56) References Cited

U.S. PATENT DOCUMENTS

| | | | | |
|---|---|---|---|---|
| 2016/0026061 | A1 | 1/2016 | O'Okeeffe | |
| 2017/0090224 | A1 | 3/2017 | Vivier | |
| 2017/0373608 | A1* | 12/2017 | Neumayr | H02M 7/48 |
| 2019/0346710 | A1* | 11/2019 | Schleder | G02F 1/0136 |
| 2020/0133042 | A1* | 4/2020 | Manz | B32B 17/10036 |

FOREIGN PATENT DOCUMENTS

| | | | | |
|---|---|---|---|---|
| CN | 109496277 A | 3/2019 | | |
| EP | 0 876 608 B1 | 4/2002 | | |
| JP | H06-186529 A | 7/1994 | | |
| JP | 2013072895 A * | 4/2013 | | |
| WO | WO 2011/033313 A1 | 3/2011 | | |
| WO | WO 2012/007334 A1 | 1/2012 | | |
| WO | WO-2019011891 A1 * | 1/2019 | | G02F 1/166 |

OTHER PUBLICATIONS

English Machine Translation of WO 2019011891, Manz et al (Year: 2025).*

International Search Report as issued in International Patent Application No. PCT/EP2021/064212, dated Sep. 14, 2021.

Search Report as issued in Chinese Patent Application No. 202180002346.3. Dated Nov. 5, 2024.

* cited by examiner

METHOD FOR ELECTRICALLY CONTROLLING A FUNCTIONAL ELEMENT ENCLOSED IN A GLAZING UNIT

CROSS-REFERENCE TO RELATED APPLICATIONS

This application is the U.S. National Stage of PCT/EP2021/064212, filed May 27, 2021, which in turn claims priority to European patent application number 20 180 208.9 filed Jun. 16, 2020. The content of these applications are incorporated herein by reference in their entireties.

The invention relates to a method for controlling a functional element enclosed in a glazing unit, a glazing assembly, and a use of the glazing assembly.

Functional elements with electrically controllable optical properties are used in the industrial production of glazing units. Such glazing units are often composite panes, in which a functional element is embedded. The composite panes consist of at least one outer pane, one inner pane, and one adhesive intermediate layer that joins the outer pane to the inner pane surface-to-surface. Typical intermediate layers are polyvinyl butyral films, which have, in addition to their adhesive properties, high toughness and high acoustic damping. The intermediate layer prevents disintegration of the composite glass pane in the event of damage. The composite pane merely cracks, but remains dimensionally stable.

Composite panes with electrically controllable optical properties are known from the prior art. Such composite panes contain a functional element, which typically contains an active layer between two flat electrodes. The optical properties of the active layer can be changed by a voltage applied on the flat electrodes. Electrochromic functional elements, known, for example, from US 20120026573 A1 and WO 2012007334 A1, are an example of this. SPD functional elements (suspended particle device) or PDLC functional elements (polymer dispersed liquid crystal), known, for example, from EP 0876608 B1 and WO 2011033313 A1, are another example. As a result of the voltage applied, the transmittance of visible light through electrochromic or SPD functional elements can be controlled.

SPD and PDLC functional elements are commercially available as multilayer films. The flat electrodes required for applying a voltage are arranged between two PET carrier films. During production of the glazing unit, the functional element is cut from the multilayer film in the desired size and shape and inserted between the films of an intermediate layer. The flat electrodes are electrically conductively connected to a control module (ECU) outside the composite pane via flat conductors. The control module is provided for applying an electrical voltage between the flat electrodes.

US 2017/0090224 A discloses a laminated vehicle glazing with a PDLC film that is operated electrically with alternating current. The AC electrical voltage is not sinusoidal, with an effective voltage of 80 $V_{eff}$ not being exceeded.

The machine translation of JP 2013072895 (A) appears to disclose a dimmer for a liquid crystal unit.

US 2020/0133042 A1 discloses a device with a functional element with electrically controllable optical properties. The device includes an electrical energy source having an output voltage, the functional element, and two electrical supply lines that connect the functional element to the energy source, wherein the output voltage has AC voltage with a frequency of 40 Hz to 210 Hz, a maximum amplitude $U_{max}$ of 24 V to 100 V, and a slope in the range of the output voltage between −80% $U_{max}$ and 80% $U_{max}$ of $0.05*U_{max}/100$ ρs to $0.1*U_{max}/100$ ρs and in the range of the output voltage U between 80% $U_{max}$ and −80% $U_{max}$ of $-0.05*U_{max}/100$ ρs to $-0.1*U_{max}/100$ ρs.

Windshields have been proposed in which an electrically controllable sun visor is implemented by a functional element to replace the mechanical foldable sun visor in motor vehicles.

Although such functional elements have a fast response to a change in the applied voltage, the apparent power required for driving them is, however, relatively high due to the mainly capacitive behavior, in particular compared to the effective power consumed.

The object of the present invention is to provide a method that uses the energy consumption of a functional element enclosed in a glazing unit as effectively as possible.

The object of the present invention is accomplished according to the invention by a method in accordance with independent claim 1. Preferred embodiments of the invention are apparent from the subclaims.

The method according to the invention for electrically controlling at least one functional element with electrically controllable optical properties enclosed in a glazing unit comprises at least the following steps:

Controlling the optical properties by means of a control unit, wherein the control unit is connected to at least two transparent flat electrodes of the functional element, Applying an electrical voltage between the flat electrodes by means of the control unit and periodically changing the polarity of the voltage, wherein the voltage has a trapezoidal profile.

With the trapezoidal profile of the voltage over time, the reduction of the voltage from the peak value is advantageously utilized. In order to lengthen the discharge phase of the flat electrodes, the voltage is gradually reduced such that the flat electrodes are discharged with a delay.

In the context of the invention, a profile with moderate slopes, a nearly trapezoidal profile, and/or a profile of a continuously differentiable function can be considered trapezoidal. Advantageously, the electrical energy discharged can be collected and stored. In contrast to conventional methods, the reactive power, which is otherwise lost in the form of thermal energy, is advantageously stored temporarily and reused.

By means of the control unit a) an increasing electrical voltage can be applied for charging the functional element, with the electrical voltage increasing to a first peak value, b) the electrical voltage can be reduced from the first peak value to a final voltage for discharging the functional element, c) the functional element can be charged with reversed polarity as in step a) with an increasing electrical voltage, with the electrical voltage increasing to a second peak value, d) the electrical voltage can be reduced from the second peak value to the final voltage for discharging the functional element, and the steps a) through d) are repeated periodically.

Furthermore, in step b) and/or in step d), electrical energy can be transferred from the functional element to the control unit. The control unit can have means for temporarily storing the electrical energy outputted by the functional module, for example, a temporary storage unit. This energy can be temporarily stored in the temporary storage unit. This energy can be used during the next charging of the functional element. For example, in step a) and/or step c), the energy temporarily stored can be used for charging the functional element.

The control unit can have a capacitor as a temporary storage unit that stores the energy transferred by the functional module. This has the advantage that conventional components can be used.

The control unit also includes means, in particular a half-bridge circuit. The half-bridge circuit is provided to convert the energy drawn from the functional element such that this energy can be stored in the temporary storage unit.

Furthermore, the control unit can have an LC filter and an output transistor (IGBT, FET, or thyristor). The control unit can further have an inductance, in particular a coil, which is electrically connected to a terminal on one of the flat electrodes and with a second terminal, the inductance is, in each case, connected to an input of a switch, in particular of a transistor.

Another advantage is the fact that the control strategy uses pulse width modulation. The electrical voltage can be changed by pulse width modulation. Based on these properties, it can be concluded that the method offers an efficient solution for controlling the electrical voltage applied.

In a preferred embodiment, the increasing voltage can be applied for the same period of time as the period of time during which the voltage is reduced to the final voltage. This results in a symmetrical progression of the electrical voltage on the flat electrodes. Furthermore, the first peak value of the voltage can be a value of, for example, 48 V, with the final voltage being 0 V. The period of the voltage can be a frequency of approx. 50 Hz.

The glazing unit comprises at least an outer pane and an inner pane that are joined to one another via a thermoplastic intermediate layer. The functional element is enclosed in the thermoplastic intermediate layer. The glazing unit is intended, in a window opening, for example, of a vehicle, a building, or a room, to separate the interior from the external surroundings. In the context of the invention, "inner pane" refers to the pane facing the interior. "Outer pane" refers to the pane facing the external surroundings. The thermoplastic intermediate layer serves to join the two panes.

The thermoplastic intermediate layer contains at least one thermoplastic polymer, preferably ethylene vinyl acetate (EVA), polyvinyl butyral (PVB), or polyurethane (PU) or mixtures or copolymers or derivatives thereof, particularly preferably PVB. The intermediate layer is typically formed from a thermoplastic film. The thickness of the intermediate layer is preferably from 0.2 mm to 2 mm, particularly preferably from 0.3 mm to 1 mm.

The outer pane and the inner pane are preferably made of glass, in particular of soda lime glass, which is customary for window panes. However, in principle, the panes can also be made of other types of glass (for example, borosilicate glass, quartz glass, aluminosilicate glass) or transparent plastics (for example, polymethyl methacrylate or polycarbonate). The thickness of the outer pane and the inner pane can vary widely. Preferably, panes with a thickness in the range from 0.8 mm to 5 mm, preferably from 1.4 mm to 2.5 mm are used, for example, those with the standard thicknesses of 1.6 mm or 2.1 mm.

The outer pane, the inner pane, and the thermoplastic intermediate layer can be clear and colorless, but also tinted or colored. A corresponding windshield must have, in the central field of vision, sufficient light transmittance, preferably at least 70% in the primary through-vision region A in accordance with ECE-R43. The outer pane and the inner panes can, independently of one another, be non-tempered, partially tempered, or tempered. If at least one of the panes is to be tempered, this can be thermal or chemical tempering.

The outer pane, the inner pane, and/or the intermediate layer can have additional suitable coatings known per se, for example, antireflection coatings, nonstick coatings, anti-scratch coatings, photocatalytic coatings, or solar protection coatings or low-E coatings.

The glazing unit can be produced by methods known per se. The outer pane and the inner pane are laminated to one another via the intermediate layer, for example, by autoclave methods, vacuum bag methods, vacuuming methods, calender methods, vacuum laminators, or combinations thereof. The joining of the outer pane and the inner pane is usually carried out under the action of heat, vacuum, and/or pressure.

The glazing unit includes a functional element with electrically controllable optical properties that is enclosed in the intermediate layer. The functional element is typically arranged between at least two layers of thermoplastic material of the intermediate layer, being bonded to the outer pane by the first layer and to the inner pane by the second layer.

Such a functional element comprises at least one active layer, which is arranged between a first carrier film and a second carrier film. The active layer has the variable optical properties that can be controlled by an electrical voltage applied to the active layer. In the context of the invention, "electrically controllable optical properties" means those properties that are continuously controllable, but also, equally, those that can be switched between two or more discrete states. The optical properties relate in particular to light transmittance and/or to scattering behavior. The functional element also includes flat electrodes for applying the voltage to the active layer, which are preferably arranged between the carrier films and the active layer.

In an advantageous embodiment, the functional element is a PDLC functional element, in particular one that switches at least one region of the glazing unit from a transparent to opaque state and vice versa. The active layer of a PDLC functional element contains liquid crystals that are embedded in a polymer matrix. In another preferred embodiment, the functional element is an SPD functional element. In this case, the active layer contains suspended particles, with the absorption of light by the active layer being variable by applying a voltage to the flat electrodes.

The flat electrodes and the active layer are arranged substantially parallel to the surfaces of the outer pane and the inner pane. The flat electrodes are connected to an external voltage source. The electrical contacting, as well as the connection to the energy source of the active layer, is implemented by suitable connecting cables, for example, flat conductors or foil conductors, which are optionally connected to the flat electrodes via so-called "bus bars", for example, strips of an electrically conductive material or electrically conductive imprints. The thickness of the functional element is, for example, from 0.4 mm to 1 mm.

The flat electrodes are preferably designed as transparent, electrically conductive layers. The flat electrodes preferably contain at least at least a metal, a metal alloy, or a transparent conducting oxide (TCO). The flat electrodes can contain, for example, silver, gold, copper, nickel, chromium, tungsten, indium tin oxide (ITO), gallium-doped or aluminum-doped zinc oxide, and/or fluorine-doped or antimony-doped tin oxide. The flat electrodes preferably have a thickness of 10 nm (nanometers) to 2 μm (microns), particularly preferably 20 nm to 1 μm, most particularly preferably 30 nm to 500 nm.

The invention also includes a glazing assembly of a vehicle or building, at least comprising a glazing unit with electrically controllable optical properties. The glazing unit comprises the outer pane and the inner pane that are joined to one another via a thermoplastic intermediate layer and in which a functional element with electrically controllable optical properties is enclosed. The functional element has an active layer with which flat electrodes on both surfaces are associated. The glazing assembly further includes a control unit for electrically controlling the optical properties of the glazing unit according to the method according to the invention, which control unit is connected to the flat electrodes of the functional element and is designed for applying an electrical voltage between the flat electrodes. The control unit is provided for periodically changing the polarity of the voltage, with the voltage having a trapezoidal profile. The control unit has, according to the invention, means for the effective utilization of the electrical energy.

According to a further aspect of the invention, a vehicle, in particular a passenger car, with the glazing assembly according to the invention is described.

A further aspect of the invention includes the use of the glazing assembly according to the invention in means of locomotion for travel on land, in the air, or on water, in particular in motor vehicles, for example, as a windshield, rear window, side window, and/or roof panel, and as a functional individual article, and as a built-in part in furniture, appliances, and buildings.

In the following, the invention is explained in detail with reference to figures and exemplary embodiments. The figures are a schematic representation and are not to scale. The figures in no way restrict the invention.

Figure 2:
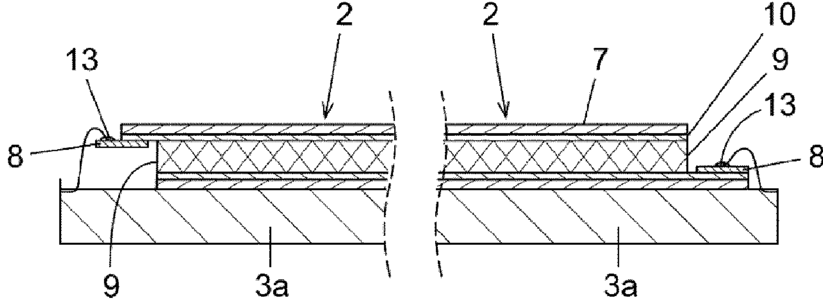
Figure 3:
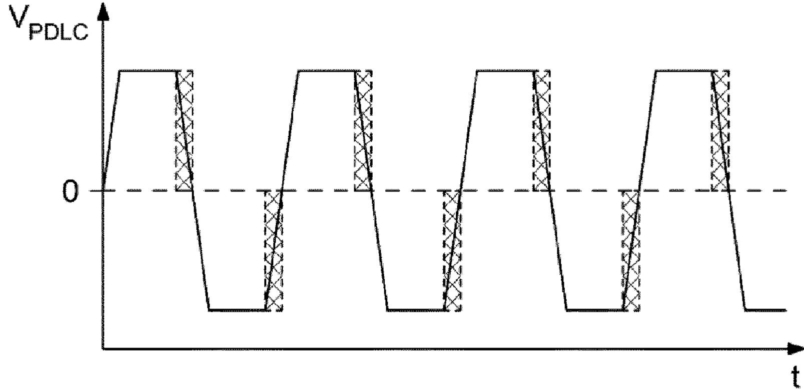
Figure 4:
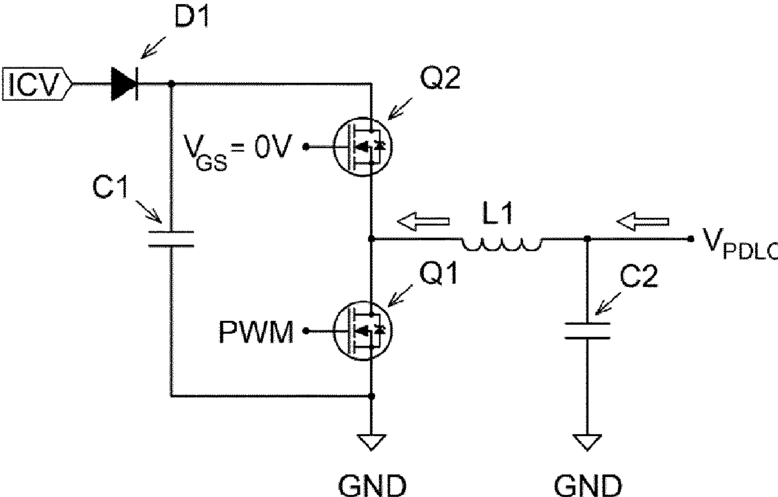
Figure 5:
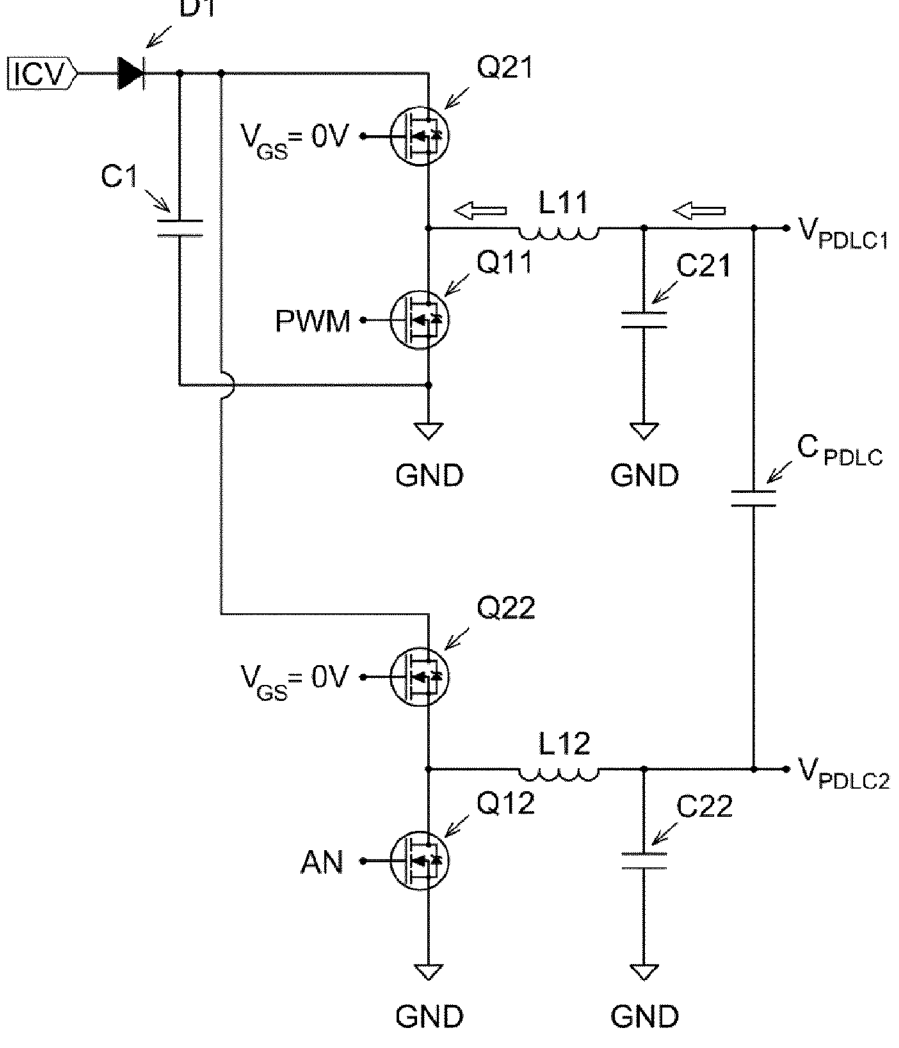
Figure 6:
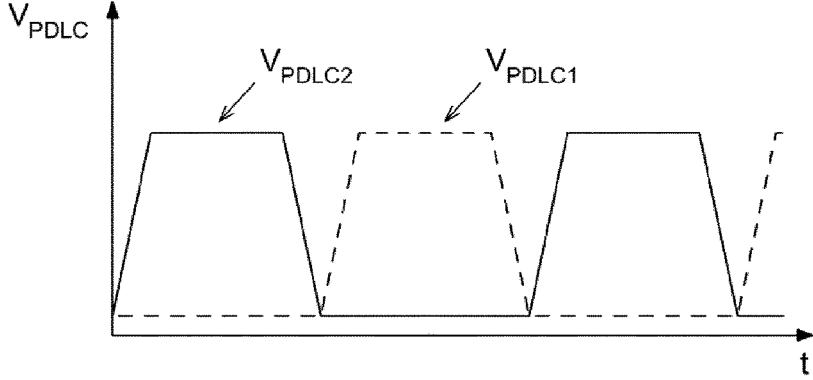
Figure 7:
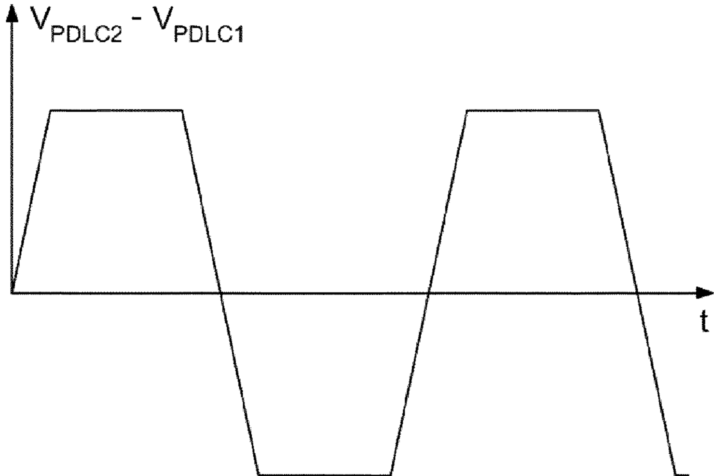
Figure 8:
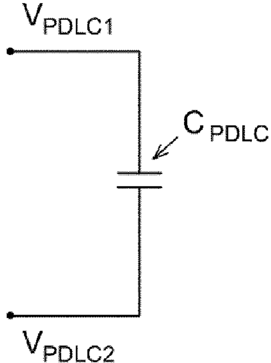

They depict:

FIG. 1 a schematic representation of a glazing assembly,

FIG. 2 a cross-sectional representation of a first thermoplastic layer with a functional element with an electrical terminal, FIG. 3 a graphic representation of a profile of an electrical voltage applied to the functional element in accordance with the method according to the invention, FIG. 4 a switching device for implementing the method according to the invention, FIG. 5 an exemplary embodiment of a switching device for operating the functional element in accordance with the method, FIG. 6 a profile of a voltage $V_{PDLC1}$ and a profile of a voltage $V_{PDLC2}$, FIG. 7 a profile of a voltage $V_{PDLC}$, and FIG. 8 an equivalent circuit diagram of the functional element.

In the exemplary embodiments, the components described represent features of the invention, in each case independently of one another, that are also to be regarded as part of the invention in isolation or even in a combination different from that depicted.

Specifications with numerical values are generally not to be understood as exact values, but also include a tolerance of ±1% up to ±10%.

FIG. 1 depicts a schematic representation of a glazing assembly 100 with a glazing unit 1, which can be installed, for example, in a motor vehicle or in a building. The glazing unit 1 comprises an outer pane 1*a* and an inner pane 1*b* that are joined to one another via an intermediate layer 3. The outer pane 1*a* has a thickness of 2.1 mm and is made of soda lime glass. The inner pane 1*b* has a thickness of 1.6 mm and is made of clear soda lime glass.

The glazing unit 1 is equipped in a central region with the functional element 2 that is enclosed in the intermediate layer 3. The intermediate layer 3 comprises a total of three thermoplastic layers, formed in each case by a thermoplastic film with a thickness of 0.38 mm made of PVB. The first thermoplastic layer 3*a* is bonded to the outer pane 1; the second thermoplastic layer 3*b*, to the inner pane 1*b*. The intervening third thermoplastic layer surrounds the cut-to-size functional element 2 (PDLC multilayer film) substantially flush on all sides. The functional element 2 is thus embedded all around in thermoplastic material and protected thereby.

FIG. 1 further depicts the switched-on state of the glazing assembly 100 with the functional element 2 enclosed in the glazing unit 1. The glazing assembly 100 also includes a control unit 11 (also called an ECU in a motor vehicle), which is electrically connected to the functional element 2 via a closed switch 12, a flat conductor, electrical terminals 13 (FIG. 2), and bus bars 8 such that an electrical voltage $V_{PDLC}$ can be applied on the terminals 13.

The optical properties of the glazing unit 1 are controlled by the control unit 11. For this purpose, the control unit 11 is electrically connected to two transparent flat electrodes 10 of the functional element 2. An electrical voltage $V_{PDLC}$ is applied between the flat electrodes 10 by the control unit 11 and the polarity of the voltage $V_{PDLC}$ is changed periodically (alternated). The voltage $V_{PDLC}$ has a trapezoidal profile, in accordance with FIG. 3.

FIG. 2 depicts a cross-sectional representation of a first thermoplastic layer 3*a* with a functional element 2 with an electrical terminal 13. In this embodiment, the first thermoplastic layer 3*a* is a PVB film with a thickness of 0.38 mm.

The functional element 2 is a multilayer film composed of an active layer 9, two flat electrodes 10, and two carrier films 11. Such multilayer films are commercially available as PDLC multilayer films. The active layer 9 is arranged between the two flat electrodes 10. The active layer 9 contains a polymer made with liquid crystals dispersed therein, which align themselves as a function of the electrical voltage applied on the flat electrodes 10, by which means the optical properties can be controlled. The carrier films 11 are made of PET and have a thickness of approx. 0.125 mm. The carrier films 11 are provided with a coating of ITO with a thickness of approx. 100 nm facing the active layer, which form the flat electrodes 10.

The flat electrodes 10 can be connected to an electrical voltage via electrically conductive bus bars 8. Here, the bus bars 8 are formed by a silver-containing screen print. Alternatively, the bus bars can be formed by electrically conductive metal strips or an electrically conductive coating. Here, “metal” (copper) includes metal alloy (copper alloy). One bus bar 8 is connected to the flat electrode 10, by recessing the carrier film 11, a flat electrode 10, and the active layer along an edge region of the respective side of the functional element 2 such that the other opposite flat electrode 10 with the associated carrier film 11 protrudes. The respective bus bar 8 is arranged on the protruding flat electrode 10.

Two conductor wires connect the bus bars 8 to an electrical voltage $V_{PDLC}$ via a flat conductor in each case. Here, one conductor wire is electrically conductively connected to a terminal region of the flat conductor in each case. In addition, an electrically conductive connection can be reinforced by a solder connection between a conductor wire and a terminal region 13 in each case.

FIG. 3 shows a graphic representation of a profile of an electrical voltage $V_{PDLC}$ applied to the functional element 2. In this example, the voltage $V_{PDLC}$ was applied to the functional element 2.

The applied electrical voltage $V_{PDLC}$ is an AC voltage. The control unit 11 generates the voltage $V_{PDLC}$ with a trapezoidal profile. The frequency of the voltage is preferably 50 Hz with an effective voltage of 48 V. The trapezoidal shape has a falling slope, marked in FIG. 3, of approx. 5% of the period duration in order to lengthen the discharge phase of the functional element. The voltage profile shown in FIG. 3 was applied to the functional element 2 as follows:

a) an increasing electrical voltage for charging the functional element 2, with the electrical voltage increasing to a first peak value, b) the electrical voltage was reduced to a final voltage of 0 V for discharging the functional element 2, c) the functional element 2 was charged with reversed polarity as in step a) with an rising electrical voltage, with the electrical voltage increasing to a second peak value, d) the electrical voltage was reduced to the final voltage of 0 V for discharging the functional element 2, and the steps a) through d) were repeated periodically.

FIG. 4 depicts a circuit diagram of an embodiment of a first half bridge with a downstream LC filter (L1, C2) at the time of the discharging of the functional element 2. Another second half bridge shown in FIG. 5 is necessary for operating the functional element.

By means of the LC filter (L1, C2) and a pulse width modulation PWM, the flat electrodes 10 are discharged with a delay immediately when the polarity is switched. The duty cycle of the PWM is decisive for the discharge time. For this purpose, an inductance, for example, coil L1, is provided in the control unit 11. The coil L1 is wired with one terminal to a flat electrode 10. With its second terminal, the coil L1 is connected to an input of a switch in each case, e.g., of a transistor (FET, thyristor, or MOSFET), Q1 and Q2. With its output, the transistor Q1 is connected to ground. The output of the transistor Q2 is connected to the first terminal of a capacitor C1 as capacitance. The voltage Vgs between the gate and source of the transistor is 0 V. The transistor Q1 can be switched by means of the pulse width modulation PWM to an electrically conductive state. A second terminal of the capacitor C1 is connected to ground. The capacitor C1 serves as temporary storage. A capacitor C2 capacitively connects the flat electrode 10 to the ground potential. The circuit shown in FIG. 4 can be operated as a half bridge with an LC filter.

To switch on transparency in the glazing unit 1, the control unit 11 generates the electrical voltage $V_{PDLC}$ at the electrical terminal 13. The control unit 11 can generate the electrical voltage $V_{PDLC}$ as AC voltage with a trapezoidal profile, as shown by way of example in FIG. 3. After the functional element 2 has been charged to 48 V, the transistor Q1 is switched with a PWM signal. While the transistor Q1 switches, a current flows from the functional element 2 (PDLC) via the coil L1 and the transistor Q1 to the potential GND (ground potential).

As soon the transistor Q1 is switched off and no current can flow via the transistor Q1, the coil L1 counteracts this such that the current continues to flow via the transistor Q2 into a capacitor C1. This increases the voltage across the capacitor C1. The energy stored in the capacitor C1 can be used as additional electrical energy for the next charging of the functional element 2 and will not dissipate as reactive power in the form of heat energy as in a conventional control unit. This result was unexpected and surprising for the person skilled in the art.

FIG. 5 depicts a switching device for operating the functional element 2. The switching device comprises the first half bridge, shown in FIG. 4, consisting of transistor Q11 and transistor Q21 with a downstream LC filter L11, C21 as well as a second half bridge. The second half bridge comprises the transistor Q12 and the transistor Q22 with a downstream LC filter L12, C22. Analogously to FIG. 4, the transistor Q11 is switched by means of PWM1 to an electrically conductive state.

The voltage $V_{PDLC}$, in particular AC voltage, applied to the functional element 2 is generated, by the two half bridges, which switch anti-cyclically between 0 V and an intermediate circuit voltage $V_{C1}$. The intermediate circuit voltage $V_{C1}$ is applied to the capacitor C1. The negative voltage "sees" only the functional element 2, since it is connected between the two outputs of the two half bridges.

The state (Vgs=0 V at Q2, PWM at Q1) shown in FIG. 4 applies only to the falling edge of the respective half bridge.

FIG. 6 through 8 illustrate the generation of the electrical voltage $V_{PDLC}$ applied to the functional element 2. FIG. 6 shows a profile of a voltage $V_{PDLC1}$, which is applied to the output of the first half bridge, as shown in FIG. 5. Furthermore, FIG. 6 shows the profile of a voltage $V_{PDLC2}$, which is applied to the output of the second half bridge. Both the voltage $V_{PDLC1}$ and the voltage $V_{PDLC2}$ have trapezoidal profiles. FIG. 7 shows a voltage difference of the voltages $V_{PDLC1}$ and $V_{PDLC2}$ as voltage $V_{PDLC}$. FIG. 8 depicts an equivalent circuit diagram of the functional element 2. A capacitance $C_{PDLC}$ represents the functional element 2, on which the electrical voltage $V_{PDLC}$, as a difference of the voltages $V_{PDLC1}$ and $V_{PDLC2}$, is applied.

LIST OF REFERENCE CHARACTERS

1 glazing unit
1*a* outer pane
1*b* inner pane
2 functional element
3 intermediate layer
3*a* first thermoplastic layer
3*b* second thermoplastic layer
7 carrier film
8 bus bar
9 active layer
10 flat electrodes
11 control unit
12 switch
13 electrical terminal
100 glazing assembly
C1 capacitor
C2, C21, C22 capacitor
D1 diode
L1, L11, L12 coil
Q1, Q11, Q12 transistor
Q2, Q21, Q22 transistor
$V_{PDLC}$, $V_{PDLC1}$, $V_{PDLC2}$ electrical voltage

The invention claimed is:

1. A method for electrically controlling at least one functional element with electrically controllable optical properties enclosed in a glazing unit, the method comprising:

controlling the optical properties by a control unit, wherein the control unit is connected to at least two transparent flat electrodes of the at least one functional element, applying an electrical voltage by the control unit between the at least two flat electrodes and periodically changing a polarity of the voltage, wherein the electrical voltage has a trapezoidal profile, and wherein by the control unit a) an increasing electrical voltage is applied for charging the at least one functional element, wherein the electrical voltage increases to a first peak value, b) the electrical voltage is reduced from the first peak value to a final voltage for discharging the at least one functional element, c) the at least one functional element is charged with the increasing electrical voltage with reversed polarity as in step a), wherein the electrical voltage increases to a second peak value, d) the electrical voltage is reduced from the second peak value to the final voltage for discharging the at least one functional element, and the steps a) through d) are repeated periodically, and wherein the control unit has an accumulator for temporary energy storage and wherein in step b) and/or in step d) electrical energy is transferred from the at least one functional element to the control unit and the control unit stores energy transferred from the at least one functional element temporarily in said accumulator;

wherein the control unit includes a switching device comprising a first half-bridge circuit connected to a first of the flat electrodes and a second half-bridge circuit connected to a second of the flat electrodes, each half-bridge circuit being connected to the respective flat electrode by an LC filter including (1) a capacitor connected having a first plate connected to the respective flat electrode and a second plate connected to a ground potential and (2) an inductor coil having a first end connected to the first plate of the capacitor and the respective flat electrode;

the first half-bridge circuit further comprising a switching transistor and the accumulator, one terminal of the accumulator being connected to a second end of the inductor of the first half-bridge circuit, the switching transistor having one terminal connected to the ground potential and another terminal connected to the second end of the inductor of the first half-bridge circuit;

wherein the switching transistor switches between (1) an off state ceasing current flow to the ground potential therethrough to cause current flowing from the second end of the inductor to charge the accumulator and (2) an on state connecting the second end of the inductor to the ground potential;

wherein a pulse width modulator is used during said discharging of step b) and/or in step d) to switch the switching transistor in accordance with a duty cycle, including to said off state to cause current flowing from the second end of the inductor to charge the accumulator and thus store energy transferred from the at least one functional element temporarily in said accumulator.

2. The method according to claim 1, wherein the electrical voltage is changed by pulse width modulation.

3. The method according to claim 1, further comprising using the energy temporarily stored in the control unit for charging the at least one functional element during step (a) and/or step (c).

4. The method according to claim 1, wherein the accumulator is a capacitor.

5. The method according to claim 1, wherein the glazing unit comprises an outer pane and an inner pane that are connected to one another via a thermoplastic intermediate layer and in which the at least one functional element is enclosed.

6. The method according to claim 1, wherein the at least one functional element is a PDLC functional element that makes the glazing unit appear transparent at least in some regions when the voltage supply is switched on and opaque when the voltage supply is switched off.

7. The method according to claim 1, wherein the increasing voltage is applied for the same period of time as the period of time during which the voltage is reduced to the final voltage.

8. The method according to claim 1, wherein the first peak value corresponds to the voltage of 48 V and/or the final voltage is 0 V.

9. A glazing assembly of a vehicle or building, comprising:

a glazing unit with electrically controllable optical properties, which comprises an outer pane and an inner pane that are joined to one another via a thermoplastic intermediate layer, and in which a functional element with electrically controllable optical properties is enclosed, comprising an active layer, with which transparent flat electrodes are associated on both surfaces, and a control unit for electrically controlling the optical properties of the glazing unit according to a method in accordance with claim 1.

10. A vehicle comprising a glazing assembly according to claim 9.

11. A method comprising providing the glazing assembly according to claim 9 in a vehicle of locomotion for travel, in the air or on water, or as a functional individual article, or as a built-in part in furniture, an appliance, or a building.

12. The method according to claim 3, wherein, in step a) and/or step c), energy temporarily stored in the control unit is used for charging the at least one functional element.

13. The method according to claim 5, wherein the switching transistor is a field-effect transistor (FE) T or thyristor.

14. The method according to claim 11, wherein the vehicle is a motor vehicle.

15. The method according to claim 11, wherein the glazing assembly is a windshield, a rear window, a side window, and/or a roof panel.

16. The method of claim 1, wherein said one terminal of the accumulator is also connected to a second end of the inductor of the second half-bridge circuit.

17. The method of claim 16, wherein each half-bridge circuit comprises an additional transistor connected between the second end of the inductor of the respective half-bridge circuit and the said one terminal of the accumulator.

18. The method of claim 16, wherein the accumulator is a capacitor, the other terminal of the capacitor being connected to ground potential.

* * * * *